US007022553B2

(12) United States Patent
Ahn et al.

(10) Patent No.: US 7,022,553 B2
(45) Date of Patent: Apr. 4, 2006

(54) COMPACT SYSTEM MODULE WITH BUILT-IN THERMOELECTRIC COOLING

(75) Inventors: Kie Y. Ahn, Chappaqua, NY (US); Leonard Forbes, Corvallis, OR (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 10/606,539

(22) Filed: Jun. 26, 2003

(65) Prior Publication Data
US 2004/0084781 A1 May 6, 2004

Related U.S. Application Data

(62) Division of application No. 09/144,307, filed on Aug. 31, 1998, now Pat. No. 6,586,835.

(51) Int. Cl.
H01L 21/50 (2006.01)
H01L 21/24 (2006.01)
H01L 21/302 (2006.01)
H01L 23/34 (2006.01)
H01L 27/16 (2006.01)

(52) U.S. Cl. .................. 438/122; 438/540; 438/715; 257/717; 257/719; 257/930

(58) Field of Classification Search ........... 257/777, 257/778, 930
See application file for complete search history.

(56) References Cited

U.S. PATENT DOCUMENTS

| 3,923,567 | A | 12/1975 | Lawrence | 156/7 |
| 3,959,047 | A | 5/1976 | Alberts et al. | 156/8 |
| 3,982,268 | A | 9/1976 | Anthony et al. | 357/55 |
| 4,081,701 | A | 3/1978 | White, Jr. et al. | 307/355 |
| 4,394,712 | A | 7/1983 | Anthony | 361/411 |
| 4,595,428 | A | 6/1986 | Anthony et al. | 148/187 |
| 4,631,636 | A | 12/1986 | Andrews | 361/385 |
| 4,653,025 | A | 3/1987 | Minato et al. | 365/154 |
| 4,710,798 | A | 12/1987 | Marcantonio | 357/80 |

(Continued)

FOREIGN PATENT DOCUMENTS

JP 02142170 * 5/1990

(Continued)

OTHER PUBLICATIONS

Beddingfield, C., et al., "Flip Chip Assembly of Motorola Fast Static RAM Known Good Die", *1997 Proceedings, 47th Electronic Components and Technology Conference*, San Jose, CA, (May 18-21, 1997), 643-648.

(Continued)

*Primary Examiner*—Carl Whitehead, Jr.
*Assistant Examiner*—James Mitchell
(74) *Attorney, Agent, or Firm*—Schwegman, Lundberg, Woessner & Kluth, P.A.

(57) ABSTRACT

An improved integrated circuit package for providing built-in heating or cooling to a semiconductor chip is provided. The improved integrated circuit package provides increased operational bandwidth between different circuit devices, e.g. logic and memory chips. The improved integrated circuit package does not require changes in current CMOS processing techniques. The structure includes the use of a silicon interposer. The silicon interposer can consist of recycled rejected wafers from the front-end semiconductor processing. Micro-machined vias are formed through the silicon interposer. The micro-machined vias include electrical contacts which couple various integrated circuit devices located on the opposing surfaces of the silicon interposer. The packaging includes a Peltier element.

30 Claims, 10 Drawing Sheets

U.S. PATENT DOCUMENTS

| | | | | |
|---|---|---|---|---|
| 4,739,446 A | | 4/1988 | Landis | 361/385 |
| 4,811,082 A | * | 3/1989 | Jacobs et al. | 257/700 |
| 4,870,470 A | | 9/1989 | Bass, Jr. et al. | 357/23.5 |
| 4,935,864 A | * | 6/1990 | Schmidt et al. | 363/141 |
| 4,977,439 A | | 12/1990 | Esquivel et al. | 357/49 |
| 5,061,987 A | | 10/1991 | Hsia | 357/71 |
| 5,079,618 A | | 1/1992 | Farnworth | 357/81 |
| 5,153,814 A | | 10/1992 | Wessely | 361/382 |
| 5,229,327 A | * | 7/1993 | Farnworth | 438/122 |
| 5,258,648 A | * | 11/1993 | Lin | 257/778 |
| 5,258,658 A | | 11/1993 | Morikawa | 257/778 |
| 5,275,001 A | | 1/1994 | Yokotani et al. | 62/3.7 |
| 5,313,361 A | | 5/1994 | Martin | 361/699 |
| 5,317,197 A | | 5/1994 | Roberts | 257/401 |
| 5,343,366 A | | 8/1994 | Cipolla et al. | 361/785 |
| 5,352,998 A | | 10/1994 | Tamino | 333/247 |
| 5,362,976 A | | 11/1994 | Suzuki | 257/81 |
| 5,371,654 A | * | 12/1994 | Beaman et al. | 361/744 |
| 5,391,917 A | | 2/1995 | Gilmour et al. | 257/690 |
| 5,392,407 A | | 2/1995 | Heil et al. | 395/325 |
| 5,409,547 A | | 4/1995 | Watanabe et al. | 136/204 |
| 5,415,699 A | | 5/1995 | Harman | 138/238 |
| 5,419,780 A | * | 5/1995 | Suski | 136/205 |
| 5,432,823 A | | 7/1995 | Gasbarro et al. | 375/356 |
| 5,438,224 A | | 8/1995 | Papageorge et al. | 257/777 |
| 5,457,342 A | * | 10/1995 | Herbst, II | 257/712 |
| 5,468,681 A | * | 11/1995 | Pasch | 438/108 |
| 5,532,506 A | | 7/1996 | Tserng | 257/276 |
| 5,567,654 A | | 10/1996 | Beilstein, Jr. et al. | 437/209 |
| 5,587,119 A | | 12/1996 | White | 264/104 |
| 5,598,031 A | | 1/1997 | Groover et al. | 257/668 |
| 5,610,366 A | | 3/1997 | Fleurial et al. | 136/202 |
| 5,618,752 A | | 4/1997 | Gaul | 438/626 |
| 5,622,875 A | | 4/1997 | Lawrence | 438/691 |
| 5,637,828 A | | 6/1997 | Russell et al. | 174/52.2 |
| 5,637,921 A | * | 6/1997 | Burward-Hoy | 257/712 |
| 5,646,067 A | | 7/1997 | Gaul | 437/180 |
| 5,656,548 A | | 8/1997 | Zavracky et al. | 438/23 |
| 5,657,481 A | | 8/1997 | Farmwald et al. | 395/551 |
| 5,682,062 A | | 10/1997 | Gaul | 257/686 |
| 5,692,558 A | | 12/1997 | Hamilton et al. | 165/80.4 |
| 5,699,291 A | | 12/1997 | Tsunemine | 365/149 |
| 5,714,791 A | | 2/1998 | Chi et al. | 257/467 |
| 5,724,818 A | * | 3/1998 | Iwata et al. | 62/3.7 |
| 5,747,728 A | | 5/1998 | Fleurial et al. | 136/203 |
| 5,753,529 A | | 5/1998 | Chang et al. | 437/67 |
| 5,767,001 A | | 6/1998 | Bertagnolli et al. | 438/455 |
| 5,781,746 A | | 7/1998 | Fleck | 395/306 |
| 5,786,628 A | | 7/1998 | Beilstein, Jr. et al. | 257/686 |
| 5,807,783 A | | 9/1998 | Gaul et al. | 438/406 |
| 5,821,624 A | | 10/1998 | Pasch | 257/776 |
| 5,824,561 A | * | 10/1998 | Kishi et al. | 438/55 |
| 5,834,799 A | | 11/1998 | Rostoker et al. | 257/98 |
| 5,855,735 A | | 1/1999 | Takada et al. | 156/636.1 |
| 5,861,666 A | | 1/1999 | Bellaar | 257/686 |
| 5,887,435 A | * | 3/1999 | Morton | 62/3.6 |
| 5,901,050 A | | 5/1999 | Imai | 361/820 |
| 5,902,118 A | | 5/1999 | Hubner | 438/106 |
| 5,903,045 A | | 5/1999 | Bertin et al. | 257/621 |
| 5,915,167 A | | 6/1999 | Leedy | 438/108 |
| 5,977,479 A | * | 11/1999 | Tokuda et al. | 174/15.4 |
| 5,990,550 A | | 11/1999 | Umezawa | 257/712 |
| 5,991,161 A | | 11/1999 | Samaras et al. | 361/760 |
| 6,016,256 A | | 1/2000 | Crane, Jr. et al. | 361/813 |
| 6,137,164 A | | 10/2000 | Yew et al. | 257/686 |
| 6,150,724 A | * | 11/2000 | Wenzel et al. | 257/777 |
| 6,223,273 B1 | | 4/2001 | Kanekawa et al. | 712/33 |
| 6,281,042 B1 | * | 8/2001 | Ahn et al. | 438/108 |
| 6,821,802 B1 | * | 11/2004 | Ahn et al. | 438/27 |
| 6,829,149 B1 | * | 12/2004 | Chang et al. | 361/771 |
| 2002/0081774 A1 | * | 6/2002 | Liang et al. | 438/108 |

FOREIGN PATENT DOCUMENTS

| | | | |
|---|---|---|---|
| JP | 4-133472 | | 5/1992 |
| JP | 05-129666 | | 5/1993 |
| JP | 05129666 | * | 5/1993 |
| JP | 406077366 | * | 3/1994 |
| JP | 08031994 | * | 2/1996 |
| JP | 408070070 | * | 3/1996 |
| WO | WO-94/05039 | | 3/1994 |

OTHER PUBLICATIONS

Blalock, T. N., et al., "A High-Speed Clamped Bit-Line Current-Mode Sense Amplifier", *IEEE Journal of Solid-State Circuits*, 26(4), (Apr. 1991), 542-548.

Cao, L., et al., "A Novel "Double-Decker" Flip-Chip/BGA Package for Low Power Giga-Hertz Clock Distribution", *1997 Proceedings, 47th Electronic Components and Technology Conference*, San Jose, CA, (May 18-21, 1997), 1152-1157.

Crisp, R., "Development of Single-Chip Multi-GB/s DRAMs", *Digest of International Solid-State Circuits Conference*, (1997), 226-227.

Crisp, R., "Rambus Technology, the Enabler", *Conference Record of WESCON*, Anaheim, CA, (Nov. 17-19, 1992), 160-165.

Demmin, J., "nCHIP's Silicon Circuit Board Technology", *National Electronic Packaging and Production Conference, NEPCON West 94, 3*, Proceedings of the Technical Program, (1993), 2038-9.

Donnelly, K. S., et al., "A 660MB/s Interface Megacell Portable Circuit in -.3 mum-0.7 mum CMOS ASIC", *IEEE Journal of Solid-State Circuits, vol. 32*, (Dec. 1996), 1995-2003.

Feinberg, I., et al., "Interposer for Chip-on-Chip Module Attachment", *IBM Technical Disclosure Bulletin, 26(9)*, (Feb. 1984), 4590-91.

Foster, R., et al., "High Rate Low-Temperature Selective Tungsten", *In: Tungsten and Other Refractory Metals for VLSI Applications III*, V.A. Wells, ed., Materials Res. Soc., Pittsburgh, PA, (1998), 69-72.

Goodman, T., et al., "The Flip Chip Market", *Advanced Packaging*, (Sep./Oct. 1997), 24-25.

Gray, P. R., et al., "Analysis and Design of Analog and Integrated Circuits", *John Wiley and Sons, 2nd ed.*, (1984), 617-622.

Heremans, P, et al., "Optoelectronic Integrated Receiver for Inter-MCM and Inter-Chip Optical Interconnects", *Technical Digest, International Electron Devices Meeting*, (Dec. 1996), 657-660.

Horie, H., et al., "Novel High Aspect Ratio Aluminum Plug for Logic/DRAM LSI's Using Polysilicon-Aluminum Substitute", *Technical Digest: IEEE International Electron Devices Meeting*, San Francisco, CA, (1996), 946-948.

Horowitz, M., et al., "PLL Design for a 500mbs Interface", *Dig. International Solid-State Circuits Conference*, (1993), 160-161.

Huth, N., "Next-Generation Memories", *Electronik, 42(23)*, (1993), 36-44.

Krishnamoorthy, A. V., et al., "Ring Oscillators with Optical and Electrical Readout Based on Hybrid GaAs MQW Modulators Bonded to 0.8 Micron Silicon VLSI Cricuits", *Electronics Lett. 31(22)*, (Oct. 26, 1995), 1917-18.

Lee, T. H., et al., "A 2.5V Delay-Locked Loop for an 18Mb 500MB/s DRAM", *Digest of International Solid-State Circuits Conference*, (1994), 300-301.

Lehmann, V., "The Physics of Macropore Formation in Low Doped n-Type Silicon", *Journal of the Electrochemical Society, 140(10)*, (Oct. 1993), 2836-2843.

Lin, C. M., et al., "Precision Embedded Thin Film Resistors for Multichip Modules (MCM-D)", *Proceedings IEEE Multichip Module Conference*, (1997), 44-9.

Mimura, T., et al., "System Module: a New Chip-on-Chip Module Technology", *Proceedings of 1997 IEEE Custom Integrated Circuit Conference*, (1997), 439-442.

Muller, K., et al., "Trench Storage Node Technology for Gigabit DRAM Generations", *Digest IEEE International Electron Devices Meeting*, San Francisco, CA, (Dec. 1996), 507-510.

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, (1987), 59-66.

Ohba, T., et al., "Selective Chemical Vapor Deposition of Tungsten Using Silane and Polysilane Reductions", *In: Tungsten and Other Refractory Metals for VLSI Applicaitons IV*, Materials Reserach Society, Pittsburgh, PA, (1989), 17-25.

Patel, N. G., et al., "Thermoelectric Cooling Effect in a p-Sb2Te3/n-Bi2Te3 Thin Film Thermocouple", *Solid-State Electronics 35(9)*, (1992), 1269-72.

Ramo, S., et al., *Fields and Waves in Communication Electronics, Third Edition*, John Wiley & Sons, Inc., (1994), pp. 428-433.

Rucker, T. G., et al., et al., "A High Performance SI on SI Multichip Module Technology", *1992 Symposium on VLSI Technology. Digest of Technical Papers, IEEE*, Japanese Society of Applied Physics, 1992 Seattle, WA, (Jun. 2-4, 1992), 72-73.

Sekine, et al., "A New High-Density Plasma Etching System Using a Dipole-Ring Magnet", *Jpn. J. Appl. Phys., Pt. 1, No. 11*, (Nov. 1995), 6274-6278.

Seraphim, D. P., et al., "Principles of Electronic Packaging.", *In: Principles of Electronic Packaging*, McGraw-Hill, New York, NY, (1989), 44, 190, 595-597.

Shafai, C., et al., "A Micro-Integrated Peltier Heat Pump for Localized On-chip Temperature Control.", *Canadian Journal of Physics, 74, Suppl., No. 1*, (1996), S139-142.

Shafai, C., et al., "Optimization of Bi2Te3 Thin Films for Microintegrated Peltier Heat Pumps", *Journal of Vacuum Science and Technology A, Second Series 15, No. 5*, Preliminary Program, 44th National Symposium of the AVS, San Jose, CA, (Sep./Oct. 1997), 2798-2801.

Su, D. K., et al., "Experimental Results and Modeling Techniques for Substrate Noise in Mixed-Signal Integrated Circuits", *IEEE Journal of Solid-State Circuits, 28(4)*, (Apr. 1993), 420-430.

Vardaman, E. J., et al., "CSPs: How new packages for cool portable products", *Solid State Technology, 40(10)*, (Oct. 1997), 84-89.

Vendier, O., et al., "A 155 Mbps Digital Transmitter Using GaAs Thin Film LEDs Bonded to Silicon Driving Circuits", *Digest IEEE/LEOS 1996 Summer Topical Meetings*, Advanced Applications of Lasers in Materials and Processing, (1996), 15-16.

Vusirikala, V., et al., "Flip-chip Optical Fiber Attachment to a Monolithic Optical Receiver Chip", *SPIE Proceedings (The International Society for Optical Engineering), 2613*, (Oct. 24, 1995), 52-58.

* cited by examiner

COMPACT SYSTEM MODULE WITH BUILT-IN THERMOELECTRIC COOLING

This application is a divisional of U.S. application Ser. No. 09/144,307 filed on Aug. 31, 1998, now U.S. Pat. No. 6,586,835, which is incorporated herein by reference.

FIELD OF THE INVENTION

The present invention relates generally to semiconductor integrated circuits. More particularly, it pertains to a compact system module with built-in thermoelectric cooling.

BACKGROUND OF THE INVENTION

Integrated circuit technology relies on transistors to formulate vast arrays of functional circuits. The complexity of these circuits requires the use of an ever increasing number of linked transistors. As the number of transistors required increases, the integrated circuitry dimensions shrink. It is one objective in the semiconductor industry to construct transistors and other discrete devices which occupy less surface area on a given silicon chip/die. At the same time, the semiconductor industry seeks to increase the speed and power offered by integrated circuits. One approach to the latter challenge is through the development of improved methods for electrically connecting and packaging circuit devices which are fabricated on the same or on different silicon chips.

Ideally, we would like to build a computing system by fabricating all the necessary integrated circuits on one wafer or chip, as compared with today's method of fabricating many chips of different functions and packaging them to assemble a system. A true "system on a chip" would greatly improve integrated circuit performance and provide higher bandwidth. Unfortunately, it is very difficult with today's technology to implement a truly high-performance "system on a chip" because of vastly different fabrication processes and different manufacturing yields for the logic and memory circuits.

As a compromise, various "system modules" have been introduced that electrically connect and package circuit devices which are fabricated on the same or on different semiconductor chips. These began with simply stacking two semiconductor chips, e.g. a logic and memory chip, one on top of the other in an arrangement commonly referred to as chip-on-chip (COC) structure. Chip-on-chip structure most commonly utilizes micro bump bonding technology (MBB) to electrically connect the two chips. Several problems, however, remain inherent with this design structure. One serious complication includes the heating which occurs most seriously in connection with a logic chip such as a microprocessor. In high-performance microprocessors, where CPUs are running at 500 MHz and dissipating up to 85 watts of power, cooling becomes a crucial issue.

Usually, the cooling of such a package is accomplished by forced air. In certain applications, however, forced air cooling is not feasible or practical. Examples of such applications include computers to be used in outer space, in a vacuum environment on earth, or in clean rooms where air circulation is not desirable. For these and other instances, a different method of cooling is required. Another cooling method includes liquid cooling, such as the forced water cooling used in the thermal conduction modules of IBM main frame computers and forced freon cooling used in Cray supercomputers. Still, liquid cooling methods can also prove too bulky, costly, and not easily adapted for use in compact high-performance integrated circuit systems, e.g. portable devices.

Thus, it is desirable to develop an improved structure and method for cooling high performance integrated circuit systems. Additionally, the improved structure and method should accommodate a dense integration and packaging for semiconductor chips, e.g. logic and memory chips.

SUMMARY OF THE INVENTION

The above mentioned problems with integrated circuits and other problems are addressed by the present invention and will be understood by reading and studying the following specification. An integrated circuit package which accords improved performance is provided.

In particular, an improved integrated circuit package for providing built-in heating or cooling to a semiconductor chip is provided. The improved integrated circuit package provides increased operational bandwidth between different circuit devices, e.g. logic and memory chips. The improved integrated circuit package does not require changes in current CMOS processing techniques. The structure includes the use of a silicon interposer. The silicon interposer can consist of recycled rejected wafers from the front-end semiconductor processing. Micro-machined vias are formed through the silicon interposer. The micro-machined vias include electrical contacts which couple various integrated circuit devices located on the opposing surfaces of the silicon interposer. The packaging includes a Peltier element.

The Peltier element, using semiconductor-based materials, functions as a small heat pump. By applying a low-voltage d-c current to the Peltier element thermal energy is transferred with the effect that one portion of the Peltier element is cooled and another heated. In one embodiment, the heated portion of the Peltier element is in contact with a heat sink or the outer cover of the integrated circuit package and the cooled portion is in contact with a semiconductor chip. Thus providing improved cooling for high frequency, high speed microprocessor chip components. In an alternative embodiment, the arrangement is reversed. This design has no moving parts, is small in size and lightweight, and has the ability to cool below or heat above the ambient temperature surrounding integrated circuit devices.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
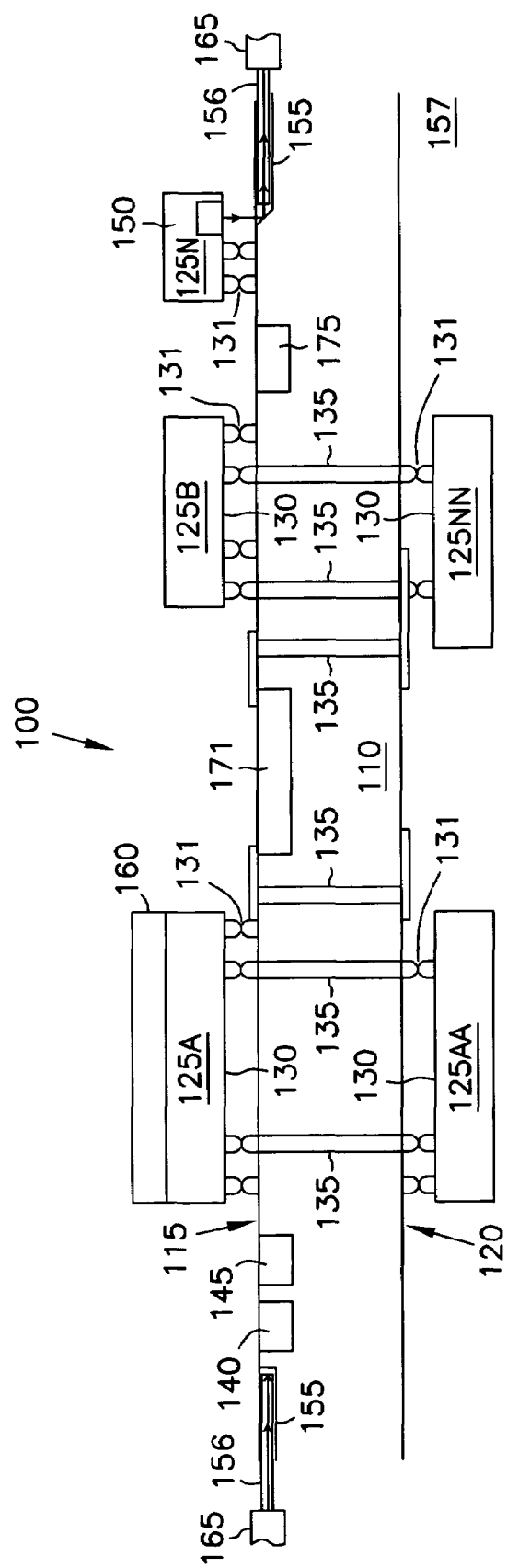
FIG. 1A is a cross-sectional view illustrating an electronic packaging assembly according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

Several illustrative embodiments of the present invention are provided below. In one illustrative embodiment of the present invention includes an electronic packaging assembly. The electronic packaging assembly includes a silicon interposer which has a first and second, or opposing sides. At least one semiconductor chip is provided on a first side of the silicon interposer. The semiconductor chip on the first side of the silicon interposer is coupled to a metal-to-semiconductor junction. At least one semiconductor chip is similarly provided on a second side of the silicon interposer. A number of electrical connections are formed through the silicon interposer and couple the semiconductor chips located on each side of the silicon interposer.

In another embodiment, an electronic system module is provided the electronic system module includes a silicon interposer having opposing surfaces. A microprocessor, which has a circuit side, faces a first one of the opposing surfaces of the silicon interposer. The microprocessor on the first side of the silicon interposer is coupled to a metal-to-semiconductor junction. A memory chip, which has a circuit side, faces a second one of the opposing surfaces of the silicon interposer. A number of electrical connections extend through the silicon interposer and couple the circuit side of the microprocessor to the circuit side of the memory chip.

In another embodiment, a computer system is provided. The computer system includes an electronic packaging assembly as presented and described above. A number of external devices are connected to the electronic packaging assembly by a system bus.

In another embodiment of the present invention, a method for cooling an integrated circuit is provided. The method includes using, or providing, a silicon interposer with opposing sides and coupling a first semiconductor chip to a first side and coupling a second semiconductor chip to a second side of the silicon interposer. A number of electrical connections through the silicon interposer electrically connect the first semiconductor chip to the second semiconductor. The method further includes forming a metal-to-semiconductor junction connected to the first semiconductor chip. A current is then passed through the metal-to-semiconductor junction in a direction so as to draw thermal energy away from the first semiconductor chip.

In another embodiment of the present invention, a method for heating an integrated circuit is provided. The method includes using, or providing, a silicon interposer with opposing sides and coupling a first semiconductor chip to a first side and coupling a second semiconductor chip to a second side of the silicon interposer. A number of electrical connections through the silicon interposer electrically connect the first semiconductor chip to the second semiconductor. The method further includes forming a metal-to-semiconductor junction connected to the first semiconductor chip. A current is then passed through the metal-to-semiconductor junction in a direction so as to draw thermal energy to the first semiconductor chip.

FIG. 1A is a cross-sectional view illustrating an electronic packaging assembly 100, or electronic system module 100, according to the teachings of the present invention. FIG. 1A includes a silicon interposer 110. The silicon interposer 110 has opposing surfaces which include a first one 115 of the opposing surfaces, or first side 115 and a second one 120 of opposing surfaces, or second side 120. In one exemplary embodiment, the silicon interposer 110 includes rejected silicon wafers which have been recycled from the front-end of the semiconductor fabrication process. The silicon interposer 110 may have active and passive devices built on one or both sides, 115 and 120. Further, the active and passive devices built on one or both sides, 115 and 120, can also include simple capacitors using the insulator and metallurgy on one side of the interposer, and can include devices such as, for example driver circuits. The electronic packaging assembly 100 includes a number of flip chips, 125A, 125B, ..., 125N respectively, located on the first side 115 of the silicon interposer 110. The electronic packaging assembly 100 additionally includes a number of flip chips, 125AA, 125BB, ..., 125NN respectively, located on the second side 120 of the silicon interposer 110. In one embodiment, the a number of flip chips, 125A, 125B, ..., 125N respectively, located on the first side 115 includes at least one semiconductor chip which is a microprocessor chip or other suitable logic chip. In one embodiment, the number of flip chips, 125AA, 125BB, ..., 125NN respectively, located on the second side 120 includes at least one semiconductor chip which is a memory chip. The memory chip can include a dynamic random access memory (DRAM)-type chip. Likewise, the memory chip can include a static random access memory (SRAM)-type chip or flash electrically erasable program read only memory (flash EEPROM)-type chip.

In alternative embodiments, the nature of the flip, or semiconductor, chips coupled to the first and second sides, 115 and 120 respectively, can be reversed or varied in any desired order. In one embodiment, capacitors are similarly included amongst the number of flip-chips, 125A, 125B, ..., 125N, or, 125AA, 125BB, ..., 125NN, and coupled to the first or second side, 115 and 120 respectively. Likewise, microprocessors and memory chips may be coupled to the same side of the silicon interposer. In one embodiment, a second or even multiple microprocessors, capacitors, and memory chips are included in the number of flip-chips, 125A, 125B, ..., 125N, or, 125AA, 125BB, ..., 125NN, and are coupled with their circuit side 130 facing the first or second side, 115 and 120 respectively, of the silicon interposer 110.

In constructing the silicon interposer 110 it is of course necessary to complete all the high-temperature process steps prior to the deposition of the interconnection metallurgy. In one embodiment, the microprocessors or logic chips are included amongst the number of flip-chips, 125A, 125B, ..., 125N, and are mounted with the circuit side 130 face-down (active circuit facing downward) to the silicon interposer 110 by a ball-grid array (BGA) 131, micro-bump bonding (MBB) 131, or controlled collapse chip connections (C-4) 131. In the same embodiment, DRAM chips which are included amongst the number of flip-chips, 125AA, 125BB, ..., 125NN and are mounted on the other side of the silicon interposer 110 with the circuit side 130 facing upward using the same or similar connection technology. Since chips will be mounted on both sides of the interposer one must be cognizant of the effects of high temperature on the solder joints previously made. This problem may be solved either by using only localized heating to reflow the solder on the second surface 120 or by using an appropriate solder hierarchy. In one embodiment, lead 2.5% (by weight) Pb—Sn solder is used on the C-4 joints of the chips, 125A, 125B, ..., 125N, mounted on the first side 115. In the same embodiment then, Pb-11 wt. % Sb is used for the chips, 125AA, 125BB, ..., 125NN, mounted on the second side 120, and Pb-62 Wt % Sn is used for card soldering. In alternative embodiments, other lower-melting point alloys, for example, Ga-based alloys can also be used.

FIG. 1A further illustrates that a number of electrical connections 135 couple the number of semiconductor chips, 125A, 125B, ..., 125N, mounted on the first side 115 to the number of semiconductor chips, 125AA, 125BB, ..., 125NN, mounted on the second side 120 of the silicon interposer 110. The number of electrical connections 135 include micro-machined vias which are formed according to the detailed description provided below in connection with FIGS. 4A–4G. The detailed description below for the number of electrical connections 135 is provided according to techniques taught in co-pending application Ser. No. 08/917,443, entitled "Integrated Circuitry and Methods of Forming Integrated Circuitry," filed on Aug. 22, 1997 or according to techniques taught in application Ser. No. 08/917,449, entitled "Methods of Forming Coaxial Integrated Circuitry Interconnect Lines, and Integrated Circuitry," filed on Aug. 22, 1997, which applications are incorporated herein by reference.

In one embodiment, as illustrate by FIG. 1A, at least one of the number of semiconductor chips, 125A, 125B, ..., 125N, is further coupled to a metal-to-semiconductor junction 160, or any other suitable Peltier Junction 160 which will produce a Peltier effect. In this application, a current passed through a Peltier Junction 160 is defined to produce a Peltier effect.

Figure 2:
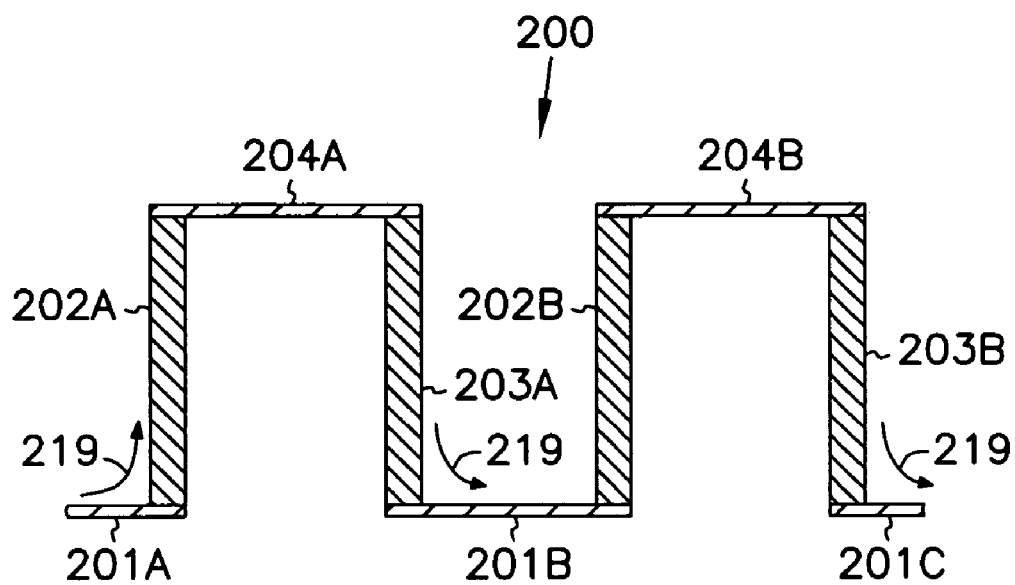
FIG. 2 is a cross-sectional view illustrating an embodiment of a Peltier element according to the teachings of the present invention.

The Peltier effect is essentially the reverse of a thermocouple effect. When a current is passed through a circuit formed from two dissimilar metals or from a metal and a semiconductor, or even certain other alloys and compounds, one junction gives off heat and is cooled and the other absorbs heat and becomes warm. The effect is reversible, e.g., if the current is reversed, thermal energy will be drawn in the opposite direction, the cool junction becomes warm and the hot junction cools. Larger temperature differences are produced with metal-to-semiconductor junctions than with metal-to-metal junctions. A metal-n-type junction produces a temperature difference in the opposite sense to that of a metal-p-type junction for the same direction of current flow. A number of such junctions can be used to form a Peltier element, an example of which is shown in FIG. 2.

The amount of thermal energy transferred, for a given current, depends on the conductors. The thermal energy that is emitted or absorbed with the passage of current through a junction of dissimilar conductors is called the Peltier heat. The quotient of the Peltier heat and the current is called the Peltier coefficient. Also, a coefficient of performance (COP) is defined in terms of the ratio of the quantity of absorbed heat to the inputted power.

Figure 1B:
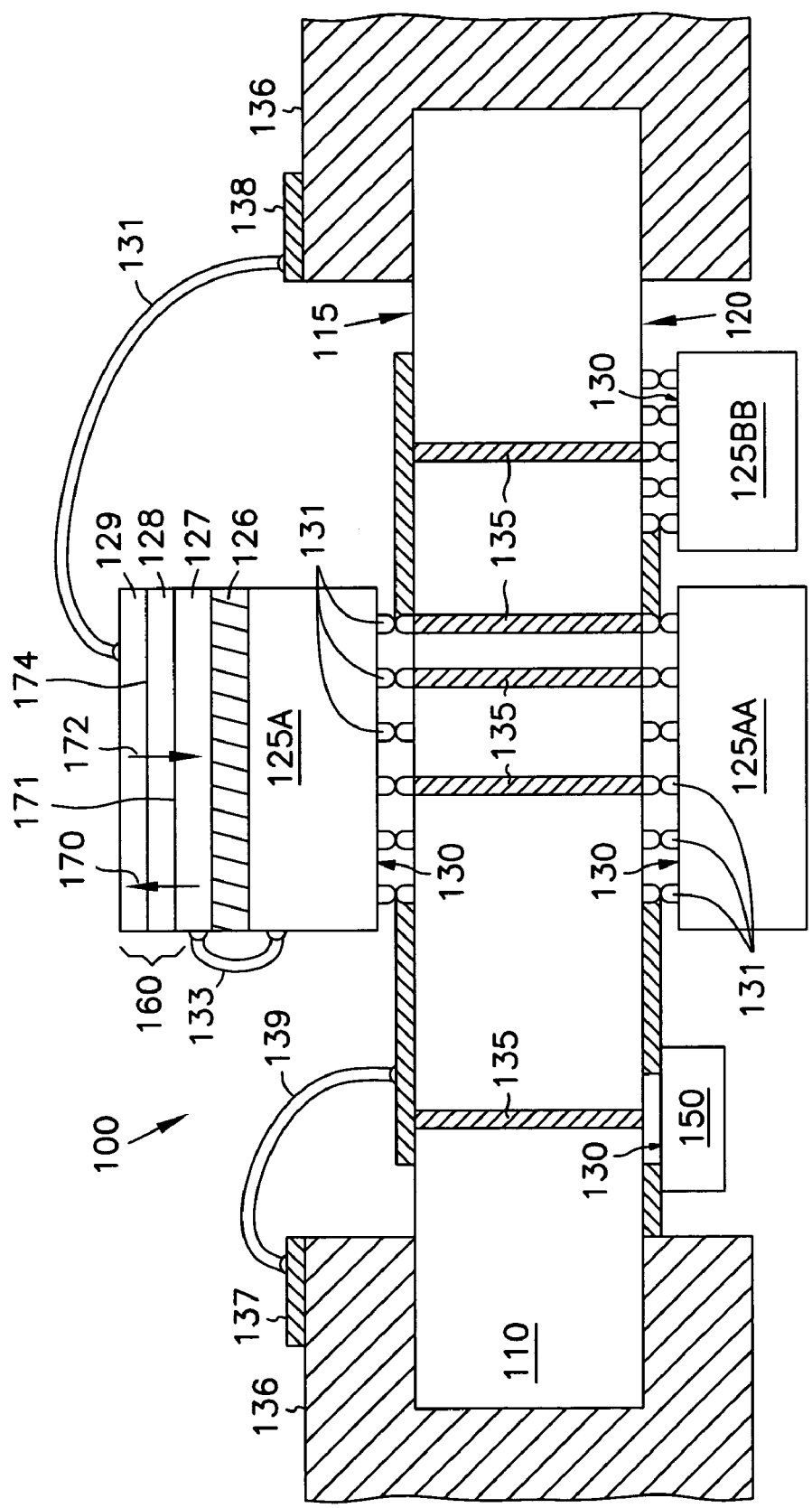
FIG. 1B is a cross-sectional view illustrating in greater detail a portion of a particular embodiment for the present invention.

FIG. 1B is a cross-sectional view illustrating in greater detail a portion of an exemplary embodiment of the present invention. In FIG. 1B, Peltier element 160 includes a semiconductor material layer 128 sandwiched between a first metal layer 127 and a second metal layer 129. The arrangement forms a first metal-to-semiconductor junction 171 between the first metal layer 127 and the semiconductor material layer 128. A second metal-to-semiconductor junction 174 is formed between the second metal layer 129 and the semiconductor material 128. In this embodiment the semiconductor material can include a range of semiconductor materials. In one such embodiment, the semiconductor material layer 128 includes an alloy of Bismuth Telluride ($Bi_2Te_3$) that has been suitably doped to provide either distinct "n" or "p" characteristics. Alternatively an alloy of Bismuth Telluride ($Bi_2Te_3$) can be suitably doped and organized to provide individual blocks of elements having distinct "n" and "p" characteristics, as illustrated by n-type blocks, 202A, 202B, ..., 202C, etc. and by p-type blocks, 203A, 203B, ..., 203C, etc. in FIG. 2.

Often, $Bi_2Te_3$ is used as the doped semiconductor material for near-room-temperature applications. Lead Telluride (PbTe) and Silicon Germanium (SiGe) are frequently used as the doped semiconductor material in higher temperature applications. Similarly suited doping techniques are employed to create the individual layers, or blocks, of Lead Telluride (PbTe) and Silicon Germanium (SiGe) compounds having distinct "n" and "p" characteristics.

FIG. 1B illustrates one embodiment in which the silicon interposer 110 is further connected to an integrated circuit package 136, or chip package 136. One of ordinary skill in the art of semiconductor fabrication will understand the manner by which the silicon interposer 110 may be connected to the chip package 136. An exemplary embodiment for constructing the same is provided in U.S. Pat. No. 5,598,031, G. L. Groover, et al, "Electrically and thermally enhanced package using a separate silicon substrate." Another exemplary embodiment for constructing the same is provided in U.S. Pat. No. 5,061,987, Hsia, Yukun, "Silicon substrate multichip assembly." In the embodiment of FIG. 1B, the chip package 136 has first and second electrical leads, 137 and 138 respectively. Further, FIG. 1B illustrates that the electronic packaging assembly 100 includes electrical coupling 139 between the first electrical lead 137 and the silicon interposer 110, and hence the semiconductor chip 125. FIG. 1B, further illustrates an electrical coupling 133 between the semiconductor chip 125 and the first metal layer 127. Also electrical coupling 139 is provided between the second metal layer 129 and a second electrical lead 138 on chip package 136. In one embodiment, the electrical coupling, 139, 133, and 131 respectively, includes wire bonding. In an alternative embodiment, the electrical coupling, 139, 133, and 131 respectively, includes any suitable coupling such as, for example, tape automated bonding (TAB).

FIG. 1A, illustrated an alternative chip package embodiment for transmitting and receiving signals from the silicon interposer 110. In FIG. 1A, signal connections from the electronic packaging assembly 100 to other components in an extended electronic system is provided by energy-efficient optical fiber interconnections. The Peltier Junction 160 included in FIG. 1A includes the "sandwich type" configuration illustrated by FIG. 1B, or an alternatively suited configuration such as, for example, the embodiment illustrated by FIG. 2. The Peltier Junction 160 is coupled to at least one of the number of semiconductor chips, 125A, 125B, ..., 125N, 125AA, 125BB, ..., 125NN, found on the silicon interposer 110. In the embodiment of FIG. 1A, the Peltier junction 160 is shown coupled to chip 125A. The Peltier Junction 160 functions according to operating techniques taught in this application or according to equivalents of the same.

FIG. 1A illustrates an optical receiver 140 adapted to receiving input signals from a fiber optical network 165. The optical receiver 140 is further coupled to a sense amplifier 145. The sense amplifier 145 and optical receiver 140 are located on the silicon interposer 110. The sense amplifier 145 is further coupled to at least one of the multiple semiconductor chips, 125A, 125B, ..., 125N, mounted on the first side 115 of the silicon interposer 110. Also illustrated in FIG. 1A is an optical emitter 150. The optical emitter 150 couples signals from at least one of the multiple semiconductor chips, 125A, 125B, ..., 125N, mounted on the first side 115 of the silicon interposer 110 to the fiber optical network. FIG. 1A provides an illustration of the V-grooves 155 located on the silicon interposer 110. Optical fibers 156 are mounted in the V-grooves 155 on the silicon interposer 110. In one embodiment, the optical receiver 140 includes a thyristor detector 140. Further, in one particular embodiment, the thyristor detector 140 includes a silicon thyristor detector 140. In an alternative embodiment, the thyristor detector 140 includes a gallium arsenide (GaAs) thyristor detector 140. In one embodiment, the optical emitter 150 includes a light-emitting diode (LED) 150. The light-emitting diode (LED) 150 can be, for instance, a gallium arsenide (GaAs) emitter. In one embodiment, the sense amplifier 145 includes a current sense amplifier 145. In one embodiment, as illustrated in FIG. 1A, the coupling between the optical emitter 150 and the fiber optical network 165 includes optical fibers 156 mounted in V-grooves 155 on the silicon interposer 110. This optical coupling can be achieved in any suitable manner and can include two (2) way channel individual optical fibers 156. One exemplary embodiment for such optical coupling is provided by the method described in V. Vusirikala, et al., "Flip-chip optical fiber attachment to a monolithic optical receiver chip," Proc. SPIE Emerging Components and Technologies for all Optical Networks, Philadelphia, Pa., USA, 24 Oct. 1995, pp. 52–58. In one embodiment, the optical emitter 150 is flip chip bonded to the silicon interposer and an end 157 in a V-groove 155 is adapted to reflect light from the optical emitter 150 into the optical fibers 156. This technique, too can be achieved in any suitable manner such as, for example, the method described in O. Vendier et al., "A 155 Mbps digital transmitter using GaAs thin film LEDs bonded to silicon driver circuits," Dig. IEEE/LEOS Summer Topical Mtg., Keystone CO., 5–9 Aug. 1996, pp. 15–16.

As stated previously the direction of the current flow through the Peltier junction 160 will determine the direction in which heat energy is transported. The following provides several exemplary embodiments of operation with reference to FIG. 1B. In one operational embodiment of FIG. 1B, the semiconductor material includes a p-type semiconductor material 128. In this embodiment, a positive lead of a voltage supply is provided to electrical lead 137 and a negative lead of a voltage supply is provided to electrical lead 138. Thus, current is passed from positive lead 137 in the direction of the arrow 170 across a metal-p-type semiconductor junction 171 located between the first metal layer 127 and p-type semiconductor material 128. According to the Peltier effect, thermal energy is thus drawn in, or follows, the direction of the current flow through the p-type semiconductor. Thus, in this operational embodiment of FIG. 1B, heat is drawn away from first metal layer 127 with a resultant cooling effect at junction 171 and a heating effect at junction 174. In this embodiment, thermal energy, or Peltier heat, is drawn away from chip 125A and the chip 125A is cooled.

Conversely, if the layer 128 remains p-type but the current flow is reversed, e.g., the polarity of the voltage supply is reversed, then thermal energy continues to be drawn in, or follow, the direction of current flow, but the direction is now in the direction of arrow 172. In this operational embodiment of FIG. 1B, heat is drawn toward first metal layer 127 with a resultant heating effect at junction 171 and a cooling effect at junction 174. In this embodiment, thermal energy, or Peltier heat is drawn toward chip 125A and chip 125A is heated.

In another exemplary embodiment of FIG. 1B, semiconductor layer 128 is an n-type semiconductor material 128. The positive lead of a voltage supply is provided to electrical lead 137 and a negative lead of a voltage supply is provided to electrical lead 138. Current is passed from positive lead 137 in the direction of the arrow 170 across a metal-to n-type semiconductor junction 171 located between the first metal layer 127 and the n-type semiconductor material 128. Current flow through the metal-to n-type semiconductor results in thermal energy being transmitted in the direction of arrow 172, opposite to the direction of current flow. Thus, in this operational embodiment of FIG. 1B, heat is drawn in the direction of junction 171 and away from junction 174. The resultant effect is that junction 171 is heated and junction 174 is cooled. Consequently, thermal energy, or heat, is drawn to chip 125A and chip 125A is heated.

Conversely, if the layer 128 remains n-type but the current flow is reversed, e.g., the polarity of the voltage supply is reversed, then thermal energy continues to be drawn opposite the direction of current flow, but the direction is now in the direction of arrow 170. In this operational embodiment of FIG. 1B, heat is drawn away from first metal layer 127 with a resultant cooling effect at junction 171 and a heating effect at junction 174. In this embodiment, thermal energy, or Peltier heat is drawn away from chip 125A and chip 125A is cooled.

As is evident from the illustrations presented above, the choice of semiconductor type material, e.g. n or p-type, and the choice of current direction can be varied without departing from the scope of the present invention. And, these above stated variables can thus be coordinated to achieve a desired objective of either heating or cooling chip 125A.

In one embodiment, shown in FIG. 1B, an insulator layer 126 separates the first metal layer 127 from the semiconductor chip 125A. In one embodiment, the adhesive insulator layer 126 includes any suitable epoxy. In an alternative embodiment, the insulator layer 126 can include any suitable material, as the same will be understood upon reading this disclosure by one of ordinary skill in the art of semiconductor fabrication. In one embodiment, the first and second metal layers, 127 and 129 respectively, are formed of copper (Cu). In an alternate embodiment, first and second metal layers, 127 and 129, are formed from any suitable metal conductor as will by understood upon reading this disclosure by one of ordinary skill in the art of semiconductor fabrication.

FIG. 2 is a cross-sectional view illustrating another embodiment of a Peltier element 200 according to the teachings of the present invention. In FIG. 2, the direction in which the current, indicated by arrows 219, is passed through the n-type, 202A, 202B, . . . , 202C, etc. and the p-type, 203A, 203B, . . . , 203C, etc. semiconductor blocks determines which direction heat energy is transferred. The direction in which the heat energy, or Peltier heat, is transferred determines which surfaces 201A, 201B, . . . , 201C, etc. or surfaces 204A, 204B, . . . , 204C, etc. are cooled and heated respectively. In example, with the current passing in the direction of arrows 219, heat is drawn in the direction of the current for current passing through a p-type semiconductor material, 203A, 203B, . . . , 203C, etc. and heat is drawn opposite to the direction of current for current passing through an n-type semiconductor material, 202A, 202B, . . . , 202C, etc. Thus, in the embodiment of FIG. 2, surfaces 201A, 201B, . . . , 201C, etc. are heated, and surfaces 204A, 204B, . . . , 204C, etc. are cooled. Conversely, if the current is reversed from the direction of arrows 219, then surfaces 201A, 201B, . . . , 201C, etc. are cooled, and surfaces 204A, 204B, . . . , 204C, etc. are heated.

In addition to the semiconductor materials presented earlier, Peltier elements can be formed from a range of other metal-to-metal, or metal-to-semiconductor combinations. FIG. 2 aids in illustrating alternative embodiments of a Peltier element constructed from such other combinations. As will be understood by one of ordinary skill in the art of semiconductor fabrication from reading this disclosure, substitution of these other combinations is included within the scope of the present invention. The following alternative embodiments provide example of this and all offer a high coefficient of performance (COP). In one exemplary embodiment each of the following combinations is adapted to provide a COP of at least 0.6 or better.

In FIG. 2 an embodiment of an isolated illustration of a Peltier element 200 is provided. In one embodiment, Peltier element 200 includes interfaces, or junctions, of metal-to-metal, or metal-to-semiconductor materials. In the exemplary embodiment, the Peltier element 200 of FIG. 2 can be suitably fabricated upon a semiconductor wafer. In one exemplary alternative embodiment, the n-type layers, or blocks, 202A, 202B, . . . , 202C, etc. and the p-type layers, or blocks, 203A, 203B, . . . , 203C, etc. include appropriately doped complex oxide semiconductors. In one embodiment, the complex oxide semiconductors include strontium (Sr) and titanium (Ti). In this embodiment the complex oxide semiconductors possess an oxygen deficiency.

The following materials are also well suited for inclusion as the n-type semiconductor layers, or blocks, 202A, 202B, . . . , 202C, etc. and the p-type semiconductor layers, or blocks, 203A, 203B, . . . , 203C, etc. In one embodiment, the n-type semiconductor layers, or blocks, 202A, 202B, . . . , 202C, etc. and the p-type semiconductor layers, or blocks, 203A, 203B, . . . , 203C, etc. are formed from a superlattice comprising alternating layers of $(PbTeSe)_m$ and $(BiSb)_n$ where m and n are the number of PbTeSe and BiSb monolayers per superlattice period. In another embodiment, the n-type semiconductor layers, or blocks, 202A, 202B, . . . , 202C, etc. and the p-type semiconductor layers, or blocks, 203A, 203B, . . . , 203C, etc. include semiconductor alloys formed between Antimony (Sb) and a transition metal (T) of Group VIII, including Cobalt, Rhodium, and Iridium (Co, Rh, and Ir), and wherein the alloy has the general formula $TSb_3$. In this embodiment, the semiconductor alloy includes a skutterudite-type crystal lattice.

Similarly well suited to the teachings of the present invention are Peltier elements 200 fabricated by thin film technology onto the backside of an semiconductor chip. An optimization of $Bi_2Te_3$ films includes forming a Copper (Cu) and doped Bismuth Telluride ($Bi_2Te_3$) junction using vacuum evaporation to form a thin film of p or n-doped Bismuth Telluride ($Bi_2Te_3$). An alternate thin film junction is formed using vacuum evaporation to form a thin film of p or n-doped Antimony Telluride ($Sb_2Te_3$). The method for such an embodiments, is provided, for example, according to the methods taught by C. Shafai and M. J. Brett, "Optimization of $Bi_2Te_3$ thin films for microintegrated Peltier heat pumps", Journal of Vacuum Science and Technology A, vol. 15, no. 5, p. 2798–801, 1997, and C. Shafai and M. J. Brett, "A micro-integrated Peltier heat pump for localized on-chip temperature control", Canadian Journal of Physics, vol. 74, no. 1, p. S139–42, 1996.

One of ordinary skill in the art of semiconductor fabrication will, upon reading this disclosure, understand the manner in which to construct the same. As explained above in detail relative to FIGS. 1B and 2, doping and current flow direction determine the direction in which thermal energy will be transported in these various alternative embodiments. The doping and current flow direction are arranged in accordance to the Peltier effect physical laws to either draw Peltier heat to or away from a chosen component. The effect being that the selected component is either cooled or heated as desired.

Figure 3:
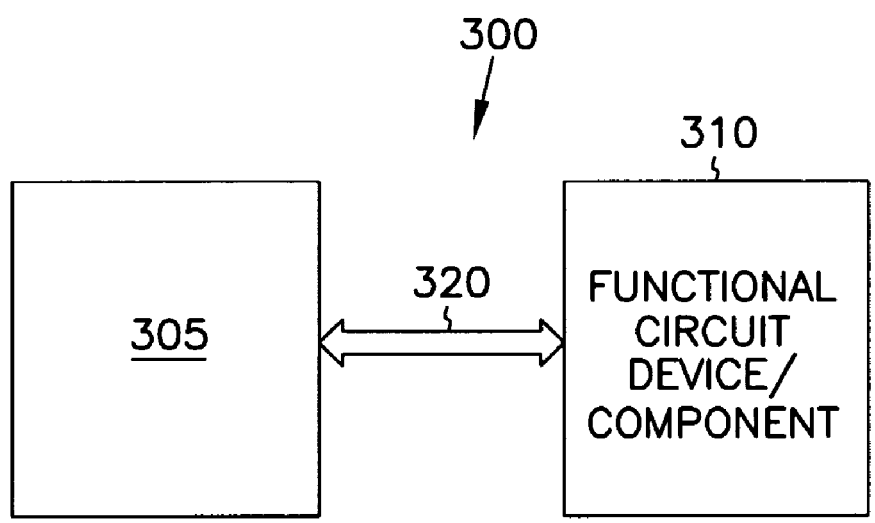
FIG. 3 is a block diagram illustrating an electronic system according to an embodiment of the present invention.

FIG. 3 is a block diagram illustrating an electronic system 300 according to an embodiment of the present invention. The electronic system 300 includes an electronic packaging assembly 305. The electronic packaging system 305 includes the electronic packaging assembly 305 presented and described in detail above. The electronic packaging assembly 305, specifically includes a semiconductor chip which is further coupled to a metal-to-semiconductor junction. The electronic system 300 includes a number of external devices 310. The number of external devices 310 include, for example, memory controllers, microprocessors and input/output bus units. The electronic system 300 includes a system bus 320. The system bus 320 couples the number of external devices 310 to the electronic packaging assembly 305.

Figure 4A:
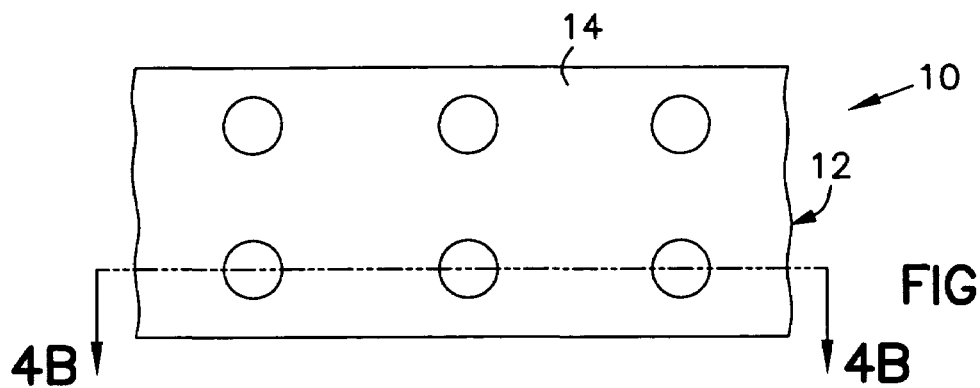
FIGS. 4A–4G illustrate an embodiment of a process of fabrication for a portion of an embodiment of the present invention.

FIGS. 4A–4G illustrate an embodiment of the various processing steps for fabricating the number of electrical connections 135 through the silicon interposer 110, as illustrated in FIG. 1. FIGS. 4A–4G illustrate an embodiment for forming salicided connections 135 through the silicon interposer 110. FIG. 4A, is a top view illustrating generally a semiconductor wafer fragment at 10.

Figure 4B:
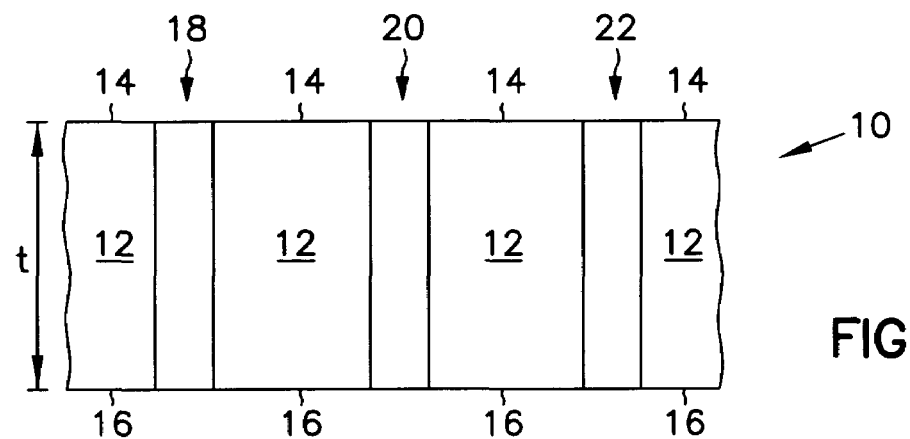

In FIG. 4B, a cross-sectional view of FIG. 4A, taken along cut-lines 4B—4B, is provided. The semiconductor wafer fragment at 10 includes a semiconductor conductive substrate. Wafer fragment 10 includes a front surface 14 and a back surface 16 and a thickness (t) which is defined between the surfaces. An exemplary thickness is around 30 mils or between around 750 to 800 micrometers (μm). FIG. 4B illustrates that amounts of the semiconductor conductive wafer material are removed to form holes or passageways 18, 20, and 22. In one embodiment, such holes are formed to a depth of not less than half of thickness (t). In one exemplary embodiment, holes 18, 20 and 22 extend perpendicularly through the entirety of wafer fragment 12 and join with front and back surfaces 14 and 16, respectively. In the exemplary embodiment, holes 18, 20, and 22 have aspect ratios greater than about 50. In another exemplary embodiment, the holes 18, 20, and 22 have aspect ratios between about 75 and 80.

In a preferred implementation, holes 18, 20, and 22 are formed or otherwise provided prior to processing of any integrated circuitry devices over either of surfaces 14, 16. In other words, the holes are formed prior to patterning any conductive material which is associated with integrated circuitry devices to be formed over either of surfaces 14 and 16. The holes 18, 20, and 22 are formed through suitable etching techniques. Alternatively, such holes are formed or drilled with a suitable laser. In one exemplary embodiment, very high aspect ratio holes are formed by placing the wafer in a semiconductor wafer processor including a dipole-ring magnetron etching reactor after which, the wafer is exposed to conditions within the dipole ring magnetron etching reactor which are sufficient to form holes which extend through the entirety of the wafer. A suitable dipole ring magnetron (DRM) reactor is described in an article entitled "Trench Storage Node Technology for Gigabit DRAM Generations," Technical Digest of International Electron Devices Meeting, Dec. 8–11, 1996, pages 507–510, published IEEE, Catalog No. 96CH35961 and authored by Muller et al. Likewise, a suitable DRM system and exemplary processing conditions are described in an article entitled "A New High-Density Plasma Etching System Using a Dipole-Ring Magnet," *Jpn. J. Appl. Phys.*, 34, pt. 1, no. 11, Nov. 1995, pages 6274–6278, and authored by Sekine et al. After formation of the holes 18, 20, and 22, the same can be temporarily filled with any material such as a photoresist to enable subsequent processing of integrated circuitry devices over either or both of surfaces 14 and 16.

Figure 4C:
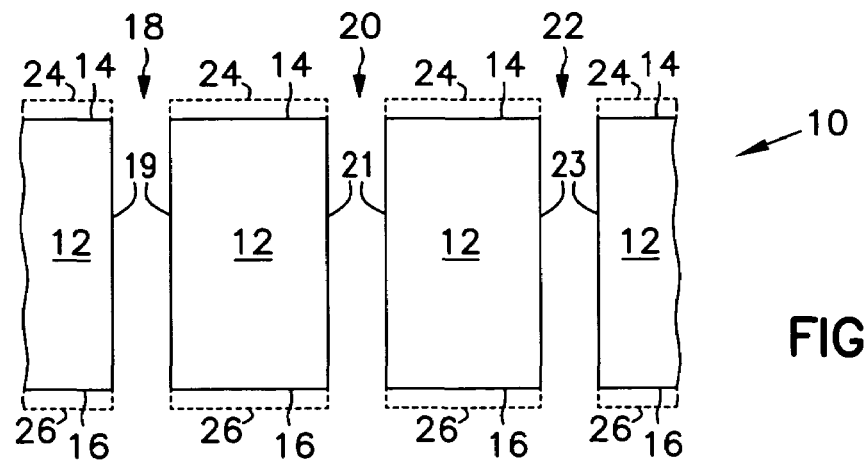

As shown in FIG. 4C and in accordance with an exemplary embodiment, integrated circuitry is formed or otherwise processed and supported by wafer fragment 10. Integrated circuitry 24 can be formed over or proximate front surface 14, back surface 16, or both front and back surfaces 14, 16, respectively.

Figure 4D:
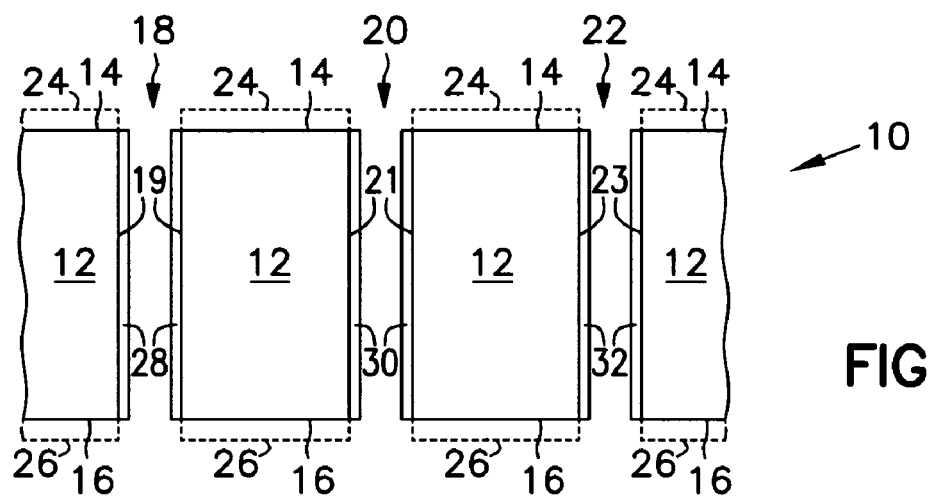

In FIG. 4D, wafer fragment 10 is exposed to conditions which are effective to form respective dielectric layers 28, 30, and 32 within each of the holes 18, 20, and 22, and proximate the respective interior surfaces 19, 21 and 23 thereof. In one embodiment, dielectric layers 28, 30, and 32 comprise a nitride-containing layer which is disposed proximate respective interior surfaces 19, 21, and 23. An oxide-containing layer is formed over the nitride-containing layer to provide a dielectric (NO) layer within the hole. In an exemplary embodiment, a nitride-containing layer is formed through chemical vapor deposition (CVD) and the oxide layer by exposing the substrate to oxidizing conditions. In one exemplary embodiment, dielectric layers 28, 30 and 32 can constitute reoxidized, low-pressure, chemical vapor deposition (LPCVD) on nitride film which forms the illustrated and preferred (NO) dielectric layer. An exemplary processing implementation includes in situ nitridation in ammonia an 950° C. LPCVD of nitride at 700° C. takes place with dichlorosilane and ammonia. Subsequently, reoxidation of the nitride takes place at a temperature between 900° C. and 950° C. Alternatively, fast thermal processing (FTP) can implement the above-described three processing steps into a single processing run. Exemplary processing methods and systems are described in the Mueller et al. article referenced above. Alternatively, dielectric layers 28, 30 and 32 can comprise a thin, silicon dioxide film. A desired and exemplary thickness of such layers is between 50–100 nanometers (nm).

Figure 4E:
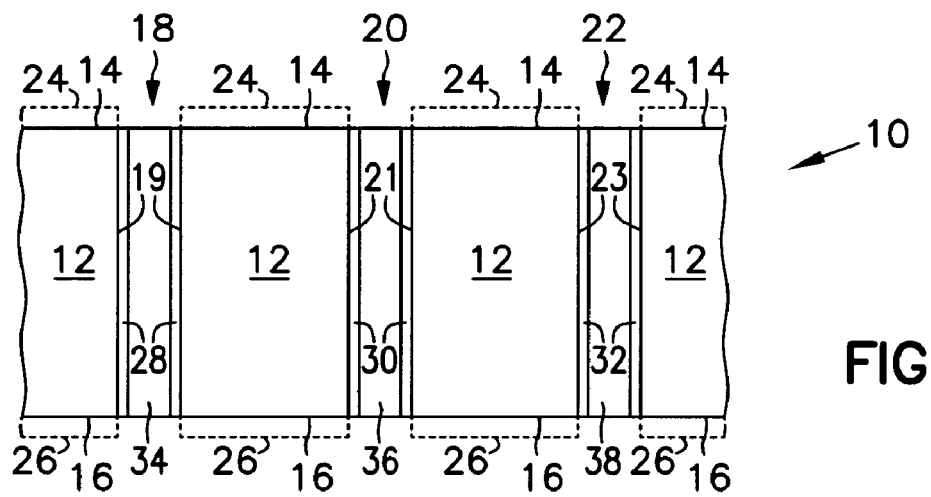

In FIG. 4E, electrical interconnect material 34, 36 and 38 is formed within holes 18, 20 and 22 respectively. Such material fills each hole and is capable of electrically interconnecting integrated circuitry formed over both front and back surfaces 14 and 16 respectively. In a preferred implementation, interconnect material 34, 36 and 38 constitute a first material which is formed within each respective hole and comprises polysilicon which is formed through CVD. Excess first material can be removed through conventional steps such as chemical mechanical planarization (CMP).

Figure 4F:
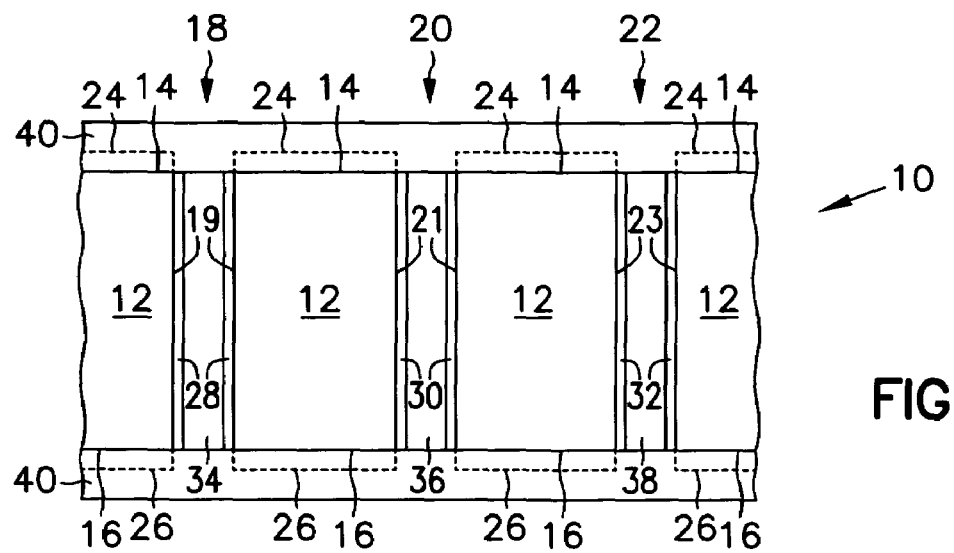

In FIG. 4F, a second layer of electrically conductive material 40 is formed over the first material 34, 36 and 38. In one embodiment, such material is formed over both front and back surfaces 14 and 16 respectively. In another embodiment, second material 40 constitutes comprising a metal material which is different from first material 34 and 36 and 38. In an exemplary embodiment, second material 40 constitutes an aluminum comprising layer or film. Such material film can be deposited through suitable sputtering or evaporation techniques. Mechanical mask can be utilized in order to define with more particularity the area over which the preferred aluminum layer is deposited. Alternatively, such a layer can be blanket deposited and subsequently processed as described below.

Figure 4G:
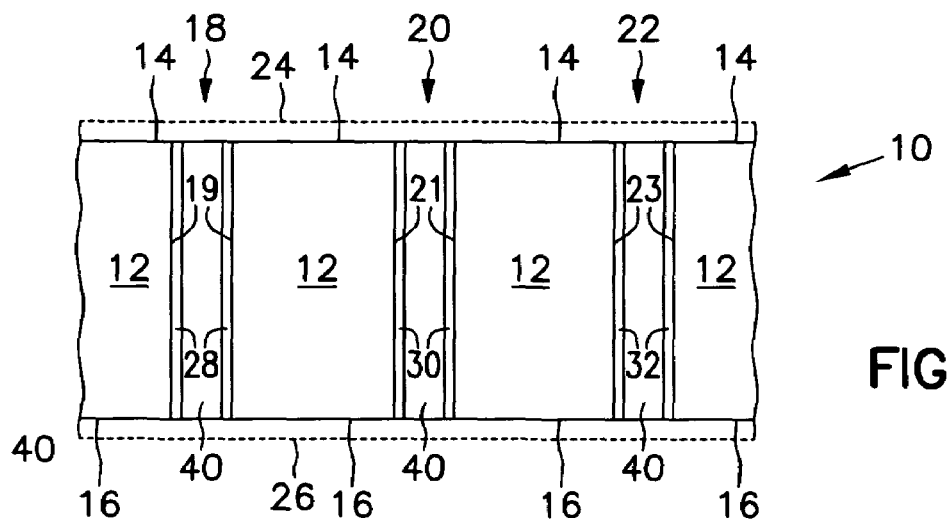

FIG. 4G illustrates the wafer fragment 10 is exposed to processing conditions which are effective to cause the second material 40 to replace the first material 34, 36 and 38.

In an exemplary embodiment, the first material 34, 36 and 38 is completely replaced with the second material 40 and the second material 40 electrically interconnects at least some of the front surface integrated circuitry 24 with at least some back surface integrated circuitry 26. Exemplary processing conditions include annealing the wafer at a temperature greater than or equal to about 500° C. for a sufficient amount of time. The thickness of the second material 40 will be determined by the size and dimensions of the interconnecting holes or passageways. As a guideline, and for a 0.175 micron diameter and 1.7 micron deep hole with an aspect ratio of 10, an aluminum thickness of 0.5 micrometers (μm) is sufficient to substitute the preferred polysilicon. Annealing times and temperatures can be decreased by forming a thin, e.g., 0.2 micrometer, titanium (Ti) layer over material 40 prior to annealing. The Ti layer acts as a polysilicon capture layer which accelerates the replacement of polysilicon with aluminum. Exemplary processing methods are described in an article entitled "Novel High-Aspect Ratio Plug for Logic/DRAM LSIs Using Polysilicon-Aluminum Substrate (PAS)," *Technical Digest of International Electron Devices Meeting*, Dec. 8–11, 1996, pages 946–948, published by IEEE, catalog number 96CH35961 and authored by Horie et al. Excess aluminum in the substitute for polysilicon can be removed through suitable processing techniques such as CMP. Alternately considered, a conductive interconnect is provided within wafer fragment 10 between and electrically connecting at least a portion of the front-formed integrated circuitry and the back-formed integrated circuitry. In the illustrated example, the integrated circuitry is formed in advance of the formation of the conductive interconnect.

In an alternate embodiment of the present invention, a method of forming coaxial integrated circuitry and interconnect lines is provided in application Ser. No. 08/917,449 entitled, "Methods of Forming Coaxial Integrated Circuitry Interconnect Lines, and Integrated Circuitry" filed on Aug. 22, 1997, which application is incorporated herein by reference.

Figure 5:
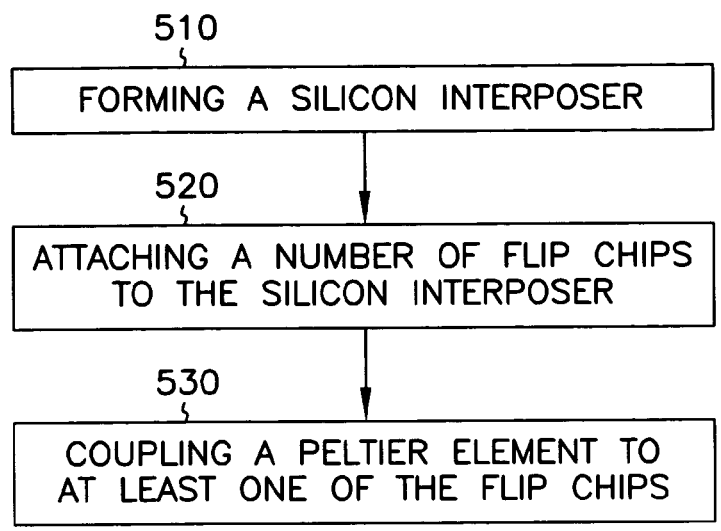
FIG. 5 illustrates, in flow diagram form, a methodical aspect according to the teachings of the present invention.

FIG. 5 illustrates, in flow diagram form, a methodical aspect according to the teachings of the present invention. A silicon interposer is formed at 510. The silicon interposer includes micro-machined vias formed through the silicon interposer. A number of flip chips are attached to the silicon interposer at 520. The flip chips couple to the micro-machined vias. A Peltier element is coupled to at least one of the flip chips at 530.

Figure 6:
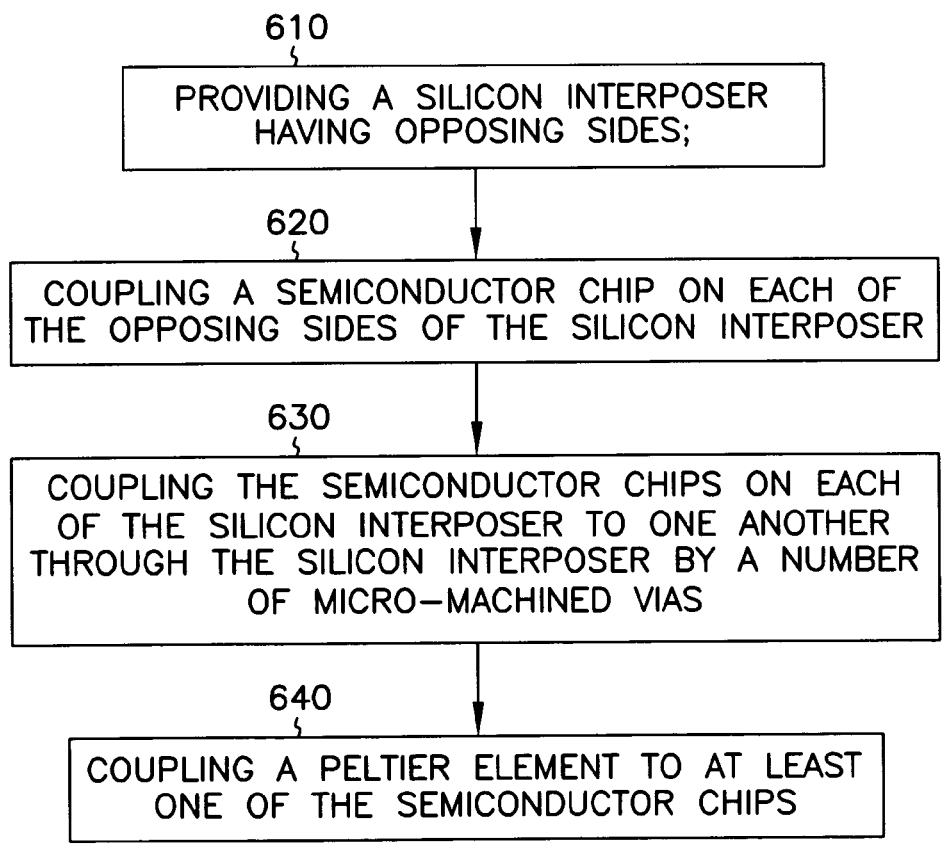
FIG. 6 illustrates, in flow diagram form, a methodical aspect for forming an electronic packaging assembly according to the teachings of the present invention.

FIG. 6 illustrates, in flow diagram form, a methodical aspect according to the teachings of the present invention. A silicon interposer is provided at 610. The silicon interposer has opposing sides. A semiconductor chip is coupled to each of the opposing sides of the silicon interposer at 620. Next, the semiconductor chips on each side of the silicon interposer are coupled to one another by a number of micro-machined vias at 630. A Peltier element is coupled to at least one of the semiconductors chips at 640.

Figure 7:
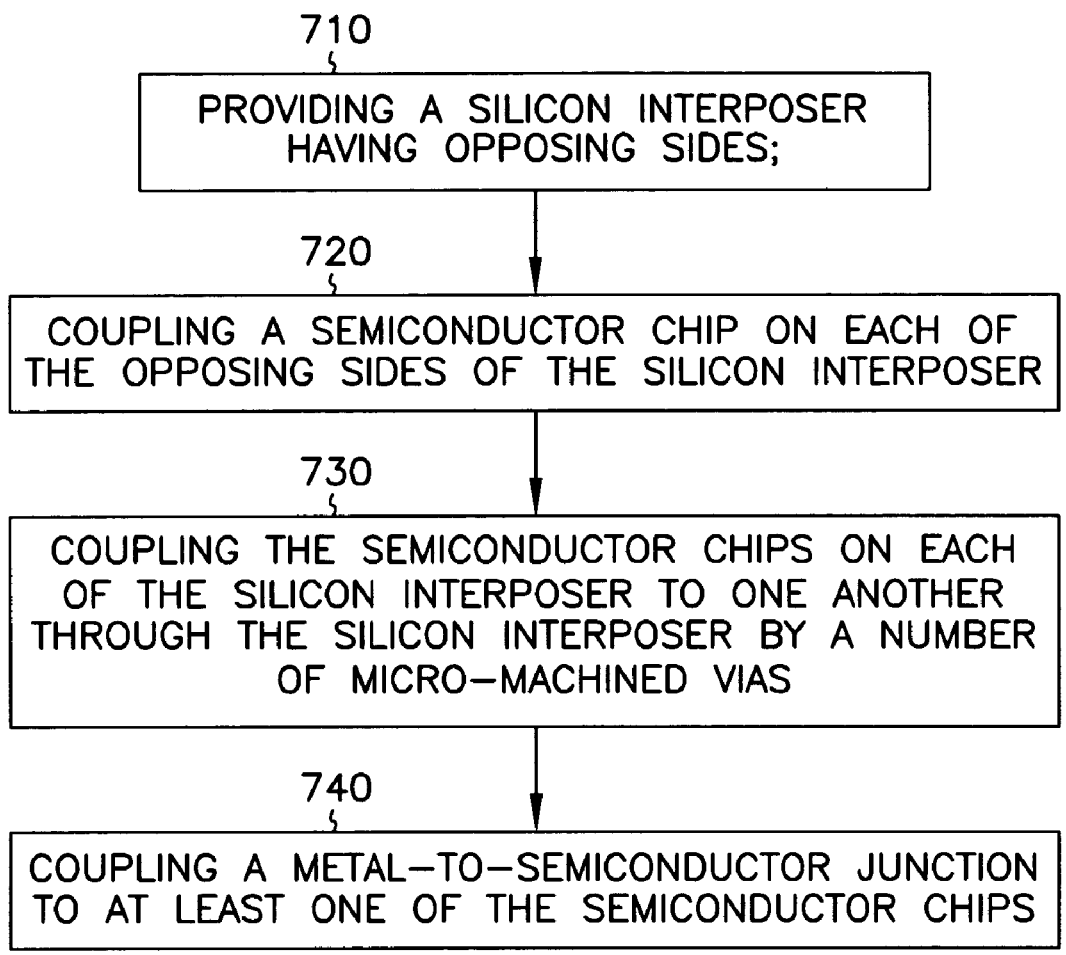
FIG. 7 illustrates, in flow diagram form, a methodical aspect for packaging an integrated circuit according to the teachings of the present invention.

FIG. 7 illustrates, in flow diagram form, a methodical aspect according to the teachings of the present invention. A silicon interposer is provided at 710. The silicon interposer has opposing sides. A semiconductor chip is coupled to each of the opposing sides of the silicon interposer at 720. Next, the semiconductor chips on each side of the silicon interposer are coupled to one another by a number of micro-machined vias at 730. The micro-machined vias provided electrical connections between the opposing sides of the silicon interposer. A metal-to-semiconductor junction is coupled to at least one of the semiconductor chips at 740.

Figure 8:
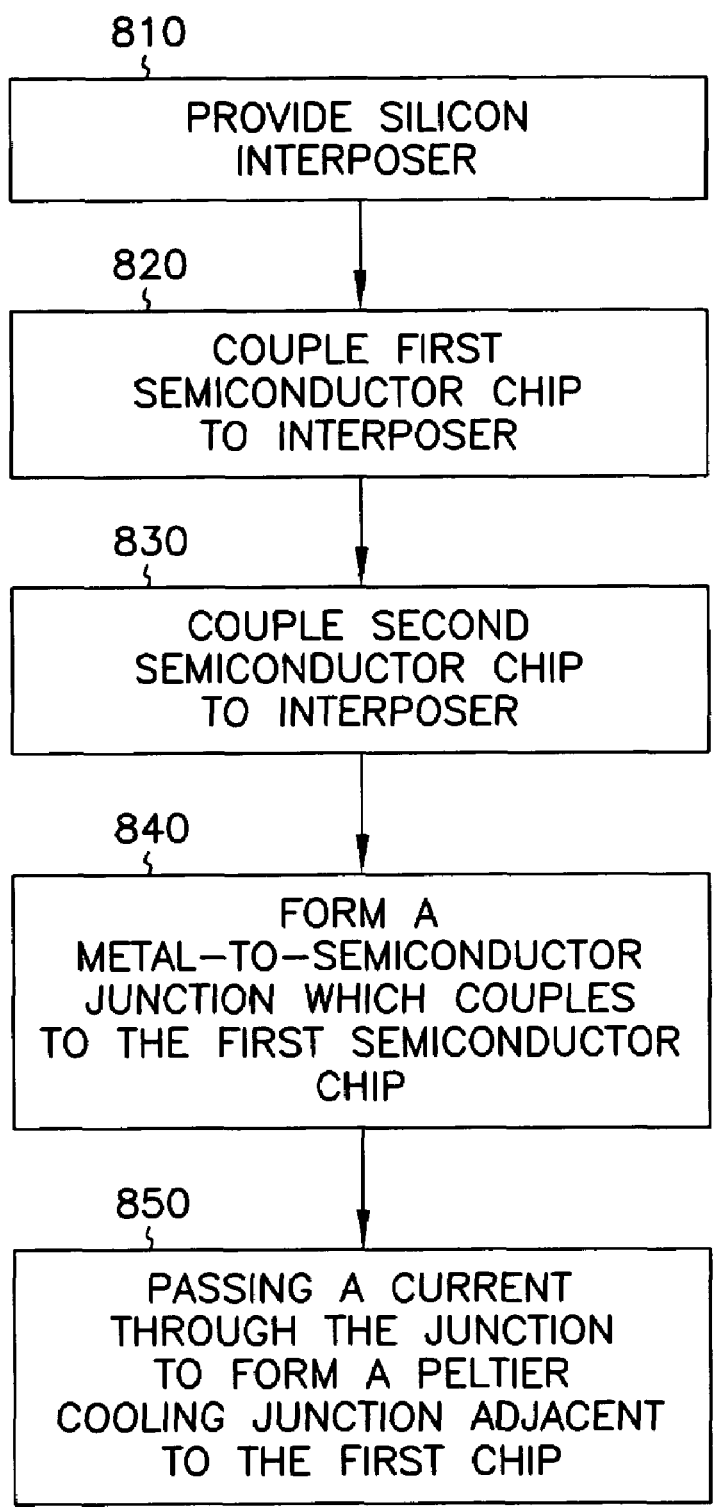
FIG. 8 illustrates, in flow diagram form, an embodiment for the method of cooling an integrated circuit according to the teachings of the present invention.

FIG. 8 illustrates, in flow diagram form, a methodical aspect according to the teachings of the present invention. A silicon interposer is provided at 810. The silicon interposer has opposing sides. A first semiconductor chip is coupled to a first side of the silicon interposer at 820. Next, a second semiconductor chip is coupled to a second side of the silicon interposer at 830. A metal-to-semiconductor junction is formed which couples to the first semiconductor chip at 840. At 850, a current is passed through the metal-to-semiconductor junction in a direction such that a Peltier cooling effect occurs adjacent to the first semiconductor chip.

Figure 9:
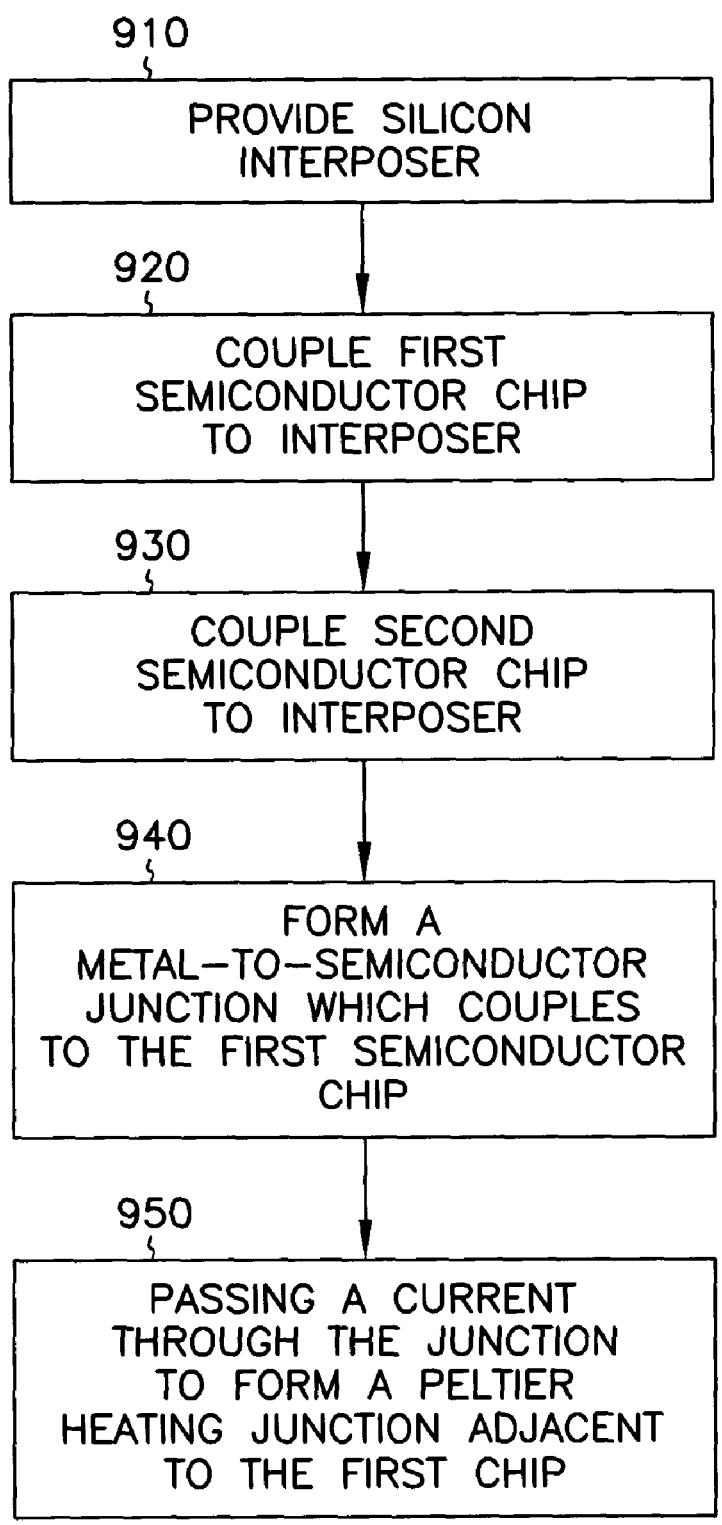
FIG. 9 illustrates, in flow diagram form, an embodiment for the method of heating an integrated circuit according to the teachings of the present invention.

FIG. 9 illustrates, in flow diagram form, a methodical aspect according to the teachings of the present invention. A silicon interposer is provided at 910. The silicon interposer has opposing sides. A first semiconductor chip is coupled to a first side of the silicon interposer at 920. Next, a second semiconductor chip is coupled to a second side of the silicon interposer at 930. A metal-to-semiconductor junction is formed which couples to the first semiconductor chip at 940. At 950, a current is passed through the metal-to-semiconductor junction in a direction such that a Peltier heating effect occurs adjacent to the first semiconductor chip.

CONCLUSION

Thus, an improved integrated circuit package for providing built-in heating or cooling to a semiconductor chip is provided. The improved integrated circuit package provides increased operational bandwidth between different circuit devices, e.g. logic and memory chips. The improved integrated circuit package does not require changes in current CMOS processing techniques. The structure includes the use of a silicon interposer. The, silicon interposer can consist of recycled rejected wafers from the front-end semiconductor processing. Micro-machined vias are formed through the silicon interposer. The micro-machined vias include electrical contacts which couple various integrated circuit devices located on the opposing surfaces of the silicon interposer. The packaging includes a Peltier element.

The Peltier element, using semiconductor-based materials, functions as a small heat pump. By applying a low-voltage d-c current to the Peltier element thermal energy is transferred with the effect that one portion of the Peltier element is cooled and another heated. In one embodiment, the heated portion of the Peltier element is in contact with a heat sink or the outer cover of the integrated circuit package and the cooled portion is in contact with a semiconductor chip. In an alternative embodiment, the arrangement is reversed. This design has no moving parts, is small in size and lightweight, and has the ability to cool below or heat above the ambient temperature surrounding integrated circuit devices.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for forming an electronic packaging assembly, comprising:
   forming a silicon interposer, wherein the interposer includes micro-machined vias formed through the silicon interposer;
   attaching a number of flip chips to the silicon interposer, wherein the flip chips couple to the micro-machined vias; and
   coupling a Peltier element to at least one of the flip chips, wherein the Peltier element is physically attached to an insulating layer on a back portion of the flip chip, and has a connection lead electrically connecting one surface of the Peltier element to the back portion of the flip chip, and a second connection lead electrically connecting another surface of the Peltier element to a voltage source.

2. The method of claim 1, wherein attaching a number of flip chips to the silicon interposer includes:
   coupling a microprocessor chip to the silicon interposer; and
   coupling a memory chip to the silicon interposer.

3. The method of claim 2, wherein coupling a memory chip to the silicon interposer includes coupling a dynamic random access memory (DRAM) chip to the silicon interposer.

4. The method of claim 2, wherein the method further includes coupling a capacitor to the silicon interposer.

5. The method of claim 1, wherein coupling a Peltier element to at least one of the flip chips includes coupling a Copper (Cu) and p-type semiconductor junction to the flip chip.

6. The method of claim 5, wherein coupling a Copper (Cu) and p-type semiconductor junction to the flip chip includes coupling a p-type semiconductor selected from the group consisting of p-doped Bismuth Telluride ($Bi_2Te_3$), p-doped Lead Telluride (PbTe), and p-doped Silicon Germanium (SiGe).

7. The method of claim 1, wherein coupling a Peltier element to at least one of the flip chips includes coupling a Copper (Cu) and n-type semiconductor junction to the flip chip.

8. The method of claim 7, wherein coupling a Copper (Cu) and n-type semiconductor junction to the flip chip includes coupling an n-type semiconductor selected from the group consisting of n-doped Bismuth Telluride ($Bi_3Te_2$), n-doped Lead Telluride (PbTe), and n-doped Silicon Germanium (SiGe).

9. A method for packaging an integrated circuit, comprising:
   providing a silicon interposer having opposing sides;
   coupling a semiconductor chip to each of the opposing sides of the silicon interposer;
   coupling the semiconductor chips on each side of the silicon interposer to one another through the silicon interposer by a number of micro-machined vias, wherein the micro-machined vias provide electrical connections between the opposing sides of the silicon interposer; and
   coupling a Peltier element to at least one of the of the semiconductor chips, wherein the Peltier element is physically attached to an insulating layer on a back portion of the flip chip, and has a connection lead electrically connecting one surface of the Peltier element to the back portion of the flip chip, and a second connection lead electrically connecting another surface of the Peltier element to a voltage source.

10. The method of claim 9, wherein coupling the Peltier element to at least one of the semiconductor chips includes coupling a metal-to-semiconductor Peltier element, wherein the semiconductor includes either an n or p-doped semiconductor alloy formed between Antimony (Sb) and a transition metal (T) from Group VIII, including Cobalt, Rhodium, and Iridium (Co, Rh, and Ir), and wherein the alloy has the general formula $Tsb_3$.

11. The method of claim 9, wherein coupling the Peltier element to at least one of the semiconductor chips includes coupling a metal-to-semiconductor Peltier element, wherein the semiconductor includes either an n or p-doped superlattice comprising alternating layers of $(PbTeSe)_m$ and $(BiSb)_n$ where m and n are the number of PbTeSe and BiSb monolayers per superlattice period.

12. The method of claim 9, wherein coupling the Peltier element to at least one of the semiconductor chips includes coupling a metal-to-semiconductor Peltier element, wherein the semiconductor is a doped complex oxide.

13. The method of claim 9, wherein coupling the Peltier element to at least one of the semiconductor chips includes coupling a metal-to-semiconductor Peltier element, wherein the semiconductor is selected from the group consisting of n-doped Bismuth Telluride ($Bi_2Te_3$), n-doped Lead Telluride (PbTe), and n-doped Silicon Germanium (SiGe).

14. The method of claim 9, wherein coupling a semiconductor chip to each of the opposing sides of the silicon interposer includes attaching a microprocessor chip to the first side of the silicon interposer.

15. The method of claim 9, wherein coupling a semiconductor chip to each of the opposing sides of the silicon interposer includes attaching a DRAM chip to a second side of the silicon interposer.

16. A method for cooling an integrated circuit, comprising:
   providing a silicon interposer having opposing sides;
   coupling a first semiconductor chip to a first side of the silicon interposer;
   coupling a second semiconductor chip to a second side of the silicon interposer, wherein a number of electrical connections through the silicon interposer couple the first semiconductor chip to the second semiconductor;
   forming a metal-to-semiconductor junction which couples to an insulator layer on a back portion of the first semiconductor chip on the first side of the silicon interposer, and having at least one connection lead electrically connecting one surface of the Peltier element to the back portion of the flip chip; and
   passing current through the metal-to-semiconductor junction in a direction such that a Peltier cooling effect occurs adjacent to the first semiconductor chip.

17. The method of claim 16, wherein coupling a first semiconductor chip to the first side of the silicon interposer includes coupling a microprocessor chip to the first side.

18. The method of claim 16, wherein coupling a second semiconductor chip to the second side of the silicon interposer includes coupling a memory chip to the second side of the silicon interposer.

19. The method of claim 16, wherein forming a metal-to-semiconductor junction includes forming a Copper (Cu) and doped Bismuth Telluride ($Bi_2Te_3$) junction.

20. The method of claim 19, wherein forming a Copper (Cu) and doped Bismuth Telluride ($Bi_2Te_3$) junction includes using vacuum evaporation to form a thin film of p-doped Bismuth Telluride ($Bi_2Te_3$).

21. The method of claim 16, wherein forming a metal-to-semiconductor junction includes forming a Copper (Cu) and doped Antimony Telluride ($Sb_2Te_3$) junction, wherein forming a Copper (Cu) and doped Antimony Telluride ($Sb_2Te_3$) junction includes using vacuum evaporation to form a thin film of doped Antimony Telluride ($Sb_2Te_3$).

22. The method of claim 16, wherein forming a metal-to-semiconductor junction includes forming a Copper (Cu) and doped semiconductor junction, wherein the semiconductor is selected from Bismuth Telluride ($Bi_2Te_3$), Lead Telluride (PbTe), and Silicon Germanium (SiGe).

23. The method of claim 16, wherein forming a metal-to-semiconductor junction includes forming a metal-to-semiconductor junction which includes a doped superlattice junction, wherein the doped superlattice includes alternating layers of $(PbTeSe)_m$ and $(BiSb)_n$ where m and n are the number of PbTeSe and BiSb monolayers per superlattice period.

24. The method of claim 16, wherein forming a metal-to-semiconductor junction includes forming a metal-to-semiconductor junction wherein the semiconductor includes a complex oxide semiconductor, and wherein the complex oxide semiconductor includes Strontium (Sr) and Titanium (Ti).

25. A method for heating an integrated circuit, comprising:
   providing a silicon interposer having opposing sides;
   coupling a first semiconductor chip to a first side of the silicon interposer;
   coupling a second semiconductor chip to a second side of the silicon interposer, wherein a number of electrical connections through the silicon interposer couple the first semiconductor chip to the second semiconductor;
   forming a metal-to-semiconductor junction which couples to an insulator layer on a back portion of the first semiconductor chip on the first side of the silicon interposer, and having at least one connection lead electrically connecting one surface of the Peltier element to the back portion of the flip chip; and
   passing current through the metal-to-semiconductor junction in a direction such that a Peltier heating effect occurs adjacent to the first semiconductor chip.

26. The method of claim 25, wherein coupling a first semiconductor chip to the first side of the silicon interposer includes coupling a microprocessor chip to the first side.

27. The method of claim 25, wherein coupling a second semiconductor chip to the second side of the silicon interposer includes coupling a memory chip to the second side of the silicon interposer.

28. The method of claim 25, wherein forming a metal-to-semiconductor junction includes forming a metal-to doped semiconductor junction wherein the semiconductor is selected from Bismuth Telluride ($Bi_2Te_3$), Lead Telluride (PbTe), and Silicon Germanium (SiGe).

29. The method of claim 25, wherein forming a metal-to-semiconductor junction includes forming a metal and doped superlattice junction, wherein the doped superlattice includes alternating layers of $(PbTeSe)_m$ and $(BiSb)_n$ where m and n are the number of PbTeSe and BiSb monolayers per superlattice period.

30. The method of claim 25, wherein forming a metal-to-semiconductor junction includes forming a metal and doped complex oxide semiconductor, wherein the complex oxide semiconductor includes Strontium (Sr) and Titanium (Ti).

\* \* \* \* \*

UNITED STATES PATENT AND TRADEMARK OFFICE
CERTIFICATE OF CORRECTION

PATENT NO. : 7,022,553 B2
APPLICATION NO. : 10/606539
DATED : April 4, 2006
INVENTOR(S) : Ahn et al.

It is certified that error appears in the above-identified patent and that said Letters Patent is hereby corrected as shown below:

On page 2, in field (56), under "U.S. Patent Documents", in column 1, line 11, delete "Morikawa" and insert -- Lin --, therefor.

On page 2, in field (56), under "Foreign Patent Documents", in column 2, line 7, after "3/1994" insert -- H01L/ 23/48 --.

On page 2, in field (56), under "Other Publications", in column 2, line 20, delete "-.3 mum" and insert -- -0.3 $\mu$m --, therefor.

On page 2, in field (56), under "Other Publications", in column 2, line 20, delete "0.7 mum" and insert -- 0.7 $\mu$m --, therefor.

On page 2, in field (56), under "Other Publications", in column 2, line 29, delete "(1998)," and insert -- (1988), --, therefor.

On page 2, in field (56), under "Other Publications", in column 2, line 50, delete "Cricuits"," and insert -- Circuits", --, therefor.

On page 2, in field (56), under "Other Publications", in column 2, line 51, after "Lett." insert -- , --.

On page 3, in field (56), under "Other Publications", in column 1, lines 21-22, delete "Applicaitons" and insert -- Applications --, therefor.

On page 3, in field (56), under "Other Publications", in column 1, line 22, delete "Reserach" and insert -- Research --, therefor.

On page 3, in field (56), under "Other Publications", in column 1, line 25, delete "Sb2Te3" and insert -- $Sb_2Te_3$ --, therefor.

On page 3, in field (56), under "Other Publications", in column 1, line 25, delete "Bi2Te3" and insert -- $Bi_2Te_3$ --, therefor.

On page 3, in field (56), under "Other Publications", in column 1, line 26, after "Electronics" insert -- , --.

On page 3, in field (56), under "Other Publications", in column 2, line 10, delete "Bi2Te3" and insert -- $Bi_2Te_3$ --, therefor.

UNITED STATES PATENT AND TRADEMARK OFFICE
CERTIFICATE OF CORRECTION

PATENT NO. : 7,022,553
APPLICATION NO. : 10/606539
DATED : April 4, 2006
INVENTOR(S) : Ahn et al.

It is certified that error appears in the above-identified patent and that said Letters Patent is hereby corrected as shown below:

On page 3, in field (56), under "Other Publications", in column 2, line 19, delete "How" and insert -- Hot --, therefor.

On page 3, in field (56), under "Other Publications", in column 2, line 23, delete "Driving" and insert -- Driver --, therefor.

In column 3, line 57, delete "horizonal" and insert -- horizontal --, therefor.

In column 7, line 18, delete "et al," and insert -- et al., --, therefor.

In column 10, line 41, delete "$Tsb_3$." and insert -- $TSb_3$. --, therefor.

In column 12, line 30, delete "an" and insert -- at --, therefor.

In column 14, line 35, delete "The," and insert -- The --, therefor.

In column 15, line 49, in Claim 8, delete "$(Bi_3Te_2)$," and insert -- $(Bi_2Te_3)$, --, therefor.

In column 15, line 63, in Claim 9, after "of the" delete "of the".

In column 16, line 11, in Claim 10, delete "$Tsb_3$." and insert -- $TSb_3$ --, therefor.

Signed and Sealed this

Eighth Day of August, 2006

JON W. DUDAS
*Director of the United States Patent and Trademark Office*